United States Patent
Reichenbach et al.

(10) Patent No.: US 10,556,789 B2
(45) Date of Patent: Feb. 11, 2020

(54) LASER RESEALING WITH STRESS-REDUCING PRESTRUCTURING

(71) Applicant: Robert Bosch GmbH, Stuttgart (DE)

(72) Inventors: Frank Reichenbach, Wannweil (DE); Jochen Reinmuth, Reutlingen (DE); Philip Kappe, Stuttgart (DE); Mawuli Ametowobla, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 557 days.

(21) Appl. No.: 15/297,794

(22) Filed: Oct. 19, 2016

(65) Prior Publication Data
US 2017/0113923 A1    Apr. 27, 2017

(30) Foreign Application Priority Data

Oct. 26, 2015  (DE) .......................... 10 2015 220 886

(51) Int. Cl.
| | | |
|---|---|---|
| *B81C 1/00* | (2006.01) | |
| *B81B 7/02* | (2006.01) | |
| *C03B 23/20* | (2006.01) | |
| *C03C 23/00* | (2006.01) | |

(52) U.S. Cl.
CPC ............ *B81B 7/02* (2013.01); *B81C 1/00269* (2013.01); *B81C 1/00333* (2013.01); *C03B 23/20* (2013.01); *C03C 23/0025* (2013.01); *B81B 2201/0235* (2013.01); *B81B 2201/0242* (2013.01); *B81B 2203/0315* (2013.01); *B81C 2203/0145* (2013.01); *B81C 2203/036* (2013.01)

(58) Field of Classification Search
CPC ......... H01L 21/54; H01L 23/10; H01L 23/26; H01L 23/055; H01L 23/057; H01L 31/0203; B81B 2201/0235; B81B 2201/0242; B81C 1/00269; B81C 1/00333
See application file for complete search history.

(56) References Cited

U.S. PATENT DOCUMENTS

| | | | | |
|---|---|---|---|---|
| 2013/0074596 | A1* | 3/2013 | Takizawa ............. | B81B 7/0041 73/504.12 |
| 2013/0265701 | A1* | 10/2013 | Takizawa ............... | H05K 5/069 361/679.01 |

FOREIGN PATENT DOCUMENTS

WO    2015120939 A1    8/2015

* cited by examiner

*Primary Examiner* — Joseph M Galvin, III
(74) *Attorney, Agent, or Firm* — Norton Rose Fulbright US LLP; Gerard Messina

(57) ABSTRACT

A method for manufacturing a micromechanical component including a substrate and a cap connected to the substrate and together with the substrate enclosing a first cavity, a first pressure prevailing and a first gas mixture with a first chemical composition being enclosed in the first cavity: in a first method step, an access opening, connecting the first cavity to surroundings of the micromechanical component, being formed in the substrate or in the cap; in a second method step, the first pressure and/or the first chemical composition being adjusted in the first cavity; in a third method step, the access opening being sealed by introducing energy and heat into an absorbing part of the substrate or the cap with the aid of a laser; in a fourth method step, a recess being formed, and/or an elevation being formed, and/or a reflection area being formed, and/or an absorption area being formed.

16 Claims, 8 Drawing Sheets

LASER RESEALING WITH STRESS-REDUCING PRESTRUCTURING

CROSS REFERENCE

The present application claims the benefit under 35 U.S.C. § 119 of German Patent Application No. DE 102015220886.9 filed on Oct. 26, 2015, which is expressly incorporated herein by reference in its entirety.

BACKGROUND INFORMATION

PCT Application No. WO 2015/120939 A1 describes a method in which, if a certain internal pressure is desired in a cavity of a micromechanical component, or if a gas mixture with a certain chemical composition is to be enclosed in the cavity, then the internal pressure or the chemical composition is frequently adjusted during capping of the micromechanical component or during the bonding process between a substrate wafer and a cap wafer. During capping, for example, a cap is connected to a substrate, whereby the cap and the substrate mutually surround the cavity. By adjusting the atmosphere or the pressure and/or the chemical composition of the gas mixture present in the surroundings during capping, the certain internal pressure and/or the certain chemical composition may thus be adjusted in the cavity.

Using the method described in PCT Application No. WO 2015/120939 A1, an internal pressure may be adjusted in a targeted way in a cavity of a micromechanical component. Using this method, it is particularly possible to manufacture a micromechanical component with a first cavity, a first pressure and a first chemical composition being adjustable in a first cavity, which differs from a second pressure and a second chemical composition at the point in time of the capping.

In the method for targeted adjusting of an internal pressure in a cavity of a micromechanical component described in PCT Application No. WO 2015/120939 A1, a small access channel to the cavity is generated in the cap or in the cap wafer or in the substrate or in the sensor wafer. The cavity is subsequently flooded with the desired gas and the desired internal pressure via the access channel. Finally, the area around the access channel is locally heated with the aid of a laser, the substrate material liquefies locally, and hermetically seals the access channel during solidification.

SUMMARY

It is an object of the present invention to provide a method for manufacturing a mechanically robust micromechanical component with a long service life compared to the related art in a simple and cost efficient way with respect to the related art. Furthermore, it is the object of the present invention to provide a compact, mechanically robust micromechanical component with a long service life compared to the related art. According to the present invention, this applies in particular to a micromechanical component including one (first) cavity. Using the method according to the present invention and the micromechanical component according to the present invention, it is additionally also possible to implement a micromechanical component in which a first pressure and a first chemical composition may be adjusted in the first cavity, and a second pressure and a second chemical composition may be adjusted in a second cavity. For example, a method of this type is provided for manufacturing micromechanical components for which it is advantageous if a first pressure is enclosed in a first cavity and a second pressure in a second cavity, whereby the first pressure is to be different from the second pressure. This is then, for example, the case, when a first sensor unit for measuring rotation rate and a second sensor unit for measuring acceleration are to be integrated into one micromechanical component.

The object may be achieved, for example,
in a fourth method step,
a recess is formed in a surface of the substrate or of the cap facing away from the first cavity in the area of the access opening for accommodating a material area of the substrate or the cap converted into a liquid aggregate state in the third method step;

and/or an elevation is formed on the surface of the substrate or of the cap facing away from the first cavity in the area of the access opening to guide the material area of the substrate or the cap converted into a liquid aggregate state in the third method step away from the access opening and generally in parallel to the surface;

and/or a reflection area is formed on or in the surface of the substrate or of the cap facing away from the first cavity in the area of the access opening for increased reflection, in contrast to the remaining surface, of laser radiation used in the third method step for introducing the energy and heat;

and/or an absorption area is formed on or in the surface of the substrate or of the cap facing away from the first cavity in the area of the access opening for increased absorption, in contrast to the remaining surface, of the laser radiation used in the third method step for introducing the energy and heat.

Thus, in a simple and cost-efficient way, a method is provided for manufacturing a micromechanical component, with which the solidified material area is manufacturable as recessed into the substrate or into the cap relative to the surface. Compared to a method without formation of the recess, the method according to the present invention has the advantage, for example, that the solidified material area projects less far beyond the surface, so that the solidified material area offers less contact surface for mechanical shocks. Thus, the solidified material area and/or the interfaces between the solidified material area and the remaining substrate or the remaining cap and/or the area around the interfaces are less susceptible to crack formations. In other words, the solidified material area is less susceptible to damages and to unintentional contact, for example, during the manufacturing flow, and is thus also less likely to be the cause or originating point of cracks due to the method according to the present invention. Using the method according to the present invention, it is also less problematic if the substrate material is only locally heated and the heated material shrinks together both during solidification as well as during cooling relative to its surroundings. The fact that a very large tensile stress may thus be generated in the sealing area is also less problematic, since, for example, by recessing the solidified material area, the contact surface is minimized with respect to mechanical shocks. Thus, spontaneously occurring crack formation is also less probable, depending on the tension and the material. Crack formation under thermal or mechanical load of the micromechanical component during further processing or in the field is also less probable, since, for example, the area of the sealed access opening is, for example, better protected. The method according to the present invention enables, in particular, that during or after the introduction of energy and heat, for example, with the aid of a laser pulse, the melting zone has a smaller melting depth, in particular, directly around the access opening, in comparison to the remaining surroundings of the access opening, in particular, in areas of the cap or of the substrate further removed from the access opening than without preprocessing, with respect to one or a selection of the alternatives in the fourth method step. In particular, it is possible, using the method according to the present invention, to prevent a point or a protrusion of the point over the surface of the substrate or of the cap in the center of the melted zone or in the center of the solidified material area, from forming during solidification of the material area due to the recrystallization dynamic. Thus, the probability of damage to such a point or an unintentional contact of the point during the further manufacturing flow is prevented by using the recess. Thus, a method for manufacturing a mechanically robust micromechanical component having a long service life in a simple and cost-efficient way is provided compared to the related art.

In connection with the present invention, the term "micromechanical component" is to be understood in that the term includes micromechanical components as well as microelectromechanical components.

The present invention is provided preferably for the manufacturing of or for a micromechanical component with a cavity. However, the present invention is also provided, for example, for a micromechanical component with two cavities or with more than two, i.e., three, four, five, six, or more than six cavities.

The access opening is preferably sealed by the introduction of energy and heat with the aid of a laser into a part of the substrate or the cap absorbing this energy and this heat. Energy and heat is hereby preferably introduced chronologically in series in the respective absorbing part of the substrate or of the cap of multiple micromechanical components, which are collectively manufactured on a wafer. However, a chronologically parallel introduction of the energy and heat into the respective absorbing part of the substrate or the cap of multiple micromechanical components is alternatively provided, for example, by using multiple laser beams or laser devices.

Advantageous embodiments and refinements of the present invention are described below with reference to the figures.

According to one preferred refinement it is provided that the cap together with the substrate encloses a second cavity, a second pressure prevailing and a second gas mixture with a second chemical composition being enclosed in the second cavity.

In another embodiment of the present invention, a method is provided for manufacturing a micromechanical component including a substrate and a cap connected to the substrate and enclosing together with the substrate a first cavity and a second cavity, a first pressure prevailing and a first gas mixture with a first chemical composition being enclosed in the first cavity, a second pressure prevailing and a second gas mixture with a second chemical composition being enclosed in the second cavity:

in a first method step, an access opening connecting the first cavity to surroundings of the micromechanical component being formed in the substrate or in the cap;

in a second method step, the first pressure and/or the first chemical composition being adjusted in the first cavity;

in a third method step, the access opening being sealed by introducing energy and heat into an absorbing part of the substrate or the cap with the aid of a laser;

in a fourth method step:

a recess being formed in a surface of the substrate or of the cap facing away from the first cavity in the area of the access opening for accommodating a material area of the substrate or the cap converted into a liquid aggregate state in the third method step;

and/or an elevation being formed on the surface of the substrate or of the cap facing away from the first cavity in the area of the access opening to guide the material area of the substrate or the cap converted into a liquid aggregate state in the third method step away from the access opening and generally in parallel to the surface;

and/or a reflection area being formed on or in the surface of the substrate or of the cap facing away from the first cavity in the area of the access opening for increased reflection, in contrast to the remaining surface, of laser radiation used in the third method step for introducing the energy and heat;

and/or an absorption area being formed on or in the surface of the substrate or of the cap facing away from the first cavity in the area of the access opening for increased absorption, in contrast to the remaining surface, of the laser radiation used in the third method step for introducing the energy and heat.

According to one preferred refinement the recess is formed in such a way that the solidified material area is situated between a plane extending generally along the surface and the first cavity. Thus, in an advantageous way, the solidified material area does not protrude beyond the surface so that the solidified material offers even less contact surface for mechanical shocks. Thus, the solidified material area and/or the interfaces between the solidified material area and the remaining substrate or the remaining cap and/or the area around the interfaces is/are less susceptible to crack formations.

According to one preferred refinement it is provided that the recess is formed in such a way that a first surface of a projection of the recess onto a plane extending generally along the surface is smaller than a second surface of a projection of the solidified material area or of the absorbing part of the substrate or of the cap onto the plane. Thus, in an advantageous way, the amount of the material area of the substrate or of the cap converted into the liquid aggregate state is reducible, and a melting bath, generated by the introduction of the energy, may flow better without requiring an unnecessarily large area of the surface for forming the recess.

According to one preferred refinement it is provided that the recess is formed in a plane extending generally in parallel to the surface, generally rotationally symmetrical and/or ring shaped with respect to the access channel or to the center of mass of the solidified material area or to the absorbing part of the substrate or of the cap. Thus, the melting bath may flow in a particularly advantageous way.

According to one preferred refinement it is provided that the recess is formed in an additional plane extending generally in parallel to the surface, spaced in the additional plane generally twice as far from the center point of the access channel as a maximum extension of the access channel is spaced apart from the center point in the additional plane. Thus, the melting bath may flow in a particularly advantageous way.

According to one preferred refinement it is provided that an elevation of the solidified material area is formed in a plane extending generally in parallel to the surface, generally rotationally symmetrical and/or ring shaped with respect to the access channel or to the center of mass of the solidified material area or to the absorbing part of the substrate or of the cap. Thus, in an advantageous way, the solidified material area lies below an otherwise (i.e., except for the area of the access opening) generally flat surface of the cap or of the substrate. Furthermore, the maximum tension in the solidified material area or in the cap or in the substrate is thus reduced. In addition, this advantageously makes it possible that the area of maximum mechanical stresses is not situated directly above the sealed access opening. Furthermore, using the method according to the present invention advantageously makes it possible that the positioning between access opening and melting bath is defined not only by the adjustment precision of the laser, but also, for example, is determined primarily by the prestructuring using a somewhat wider laser pulse. Thus, the prestructuring may be carried out very exactly, for example, in contrast to conventional methods. Thus, the melting bath may, for example, be very exactly reproduced in its form, and its form relative to the access opening despite a small fluctuation in the laser precision. Thus, an effective possibility is provided for reducing the probability that the solidified material area is the cause or originating point of cracks.

In addition, another subject matter of the present invention is a micromechanical element including a substrate and a cap connected to the substrate and enclosing together with the substrate a first cavity, a first pressure prevailing and a first gas mixture with a first chemical composition being enclosed in the first cavity, the substrate or the cap including a sealed access opening, the substrate or the cap including:
  a recess situated in a surface of the substrate or of the cap facing away from the first cavity in the area of the access opening for accommodating a material area of the substrate or the cap converted into a liquid aggregate state during sealing of the access opening;
  and/or an elevation situated on the surface of the substrate or of the cap facing away from the first cavity in the area of the access opening to guide the material area of the substrate or the cap converted into a liquid aggregate state during sealing of the access opening generally away from the access opening and generally in parallel to the surface;
  and/or a reflection area situated on or in the surface of the substrate or of the cap facing away from the first cavity in the area of the access opening for increased reflection, in contrast to the remaining surface, of laser radiation used during sealing of the access opening for introducing the energy and heat;
  and/or an absorption area situated on or in the surface of the substrate or of the cap facing away from the first cavity in the area of the access opening for increased absorption, in contrast to the remaining surface, of laser radiation used during sealing of the access opening for introducing the energy and heat.

According to a preferred refinement it is provided that the cap together with the substrate encloses a second cavity, a second pressure prevailing and a second gas mixture with a second chemical composition being enclosed in the second cavity.

Furthermore, another subject matter of the present invention is a micromechanical element including a substrate and a cap connected to the substrate and together with the substrate encloses a first cavity and a second cavity, a first pressure prevailing and a first gas mixture with a first chemical composition being enclosed in the first cavity, a second pressure prevailing and a second gas mixture with a second chemical composition being enclosed in the second cavity, the substrate or the cap includes a sealed access opening, the substrate or the cap including:
  a recess situated in a surface of the substrate or of the cap facing away from the first cavity in the area of the access opening for accommodating a material area of the substrate or the cap converted into a liquid aggregate state during sealing of the access opening;
  and/or an elevation situated on the surface of the substrate or of the cap facing away from the first cavity in the area of the access opening to guide the material area of the substrate or the cap converted into a liquid aggregate state during sealing of the access opening generally away from the access opening and generally in parallel to the surface;
  and/or a reflection area situated on or in the surface of the substrate or of the cap facing away from the first cavity in the area of the access opening for increased reflection, in contrast to the remaining surface, of laser radiation used during sealing of the access opening for introducing the energy and heat;
  and/or an absorption area situated on or in the surface of the substrate or of the cap facing away from the first cavity in the area of the access opening for increased absorption, in contrast to the remaining surface, of laser radiation used during sealing of the access opening for introducing the energy and heat. Thus, a compact, mechanically robust, and cost-efficient micromechanical component is provided in an advantageous way with adjusted first pressure and second pressure. The mentioned advantages of the method according to the present invention correspondingly also apply for the micromechanical component according to the present invention.

According to one preferred refinement it is provided that the recess is formed in such a way that the solidified material area is situated between a plane extending generally along the surface and the first cavity. Thus, in an advantageous way, a micromechanical component is provided which is particularly robust against mechanical shocks.

According to one preferred refinement it is provided that an elevation of the solidified material area is formed in a plane extending generally in parallel to the surface, generally rotationally symmetrical and/or ring shaped with respect to the access channel or to the center of mass of the solidified material area or to the absorbing part of the substrate or of the cap. It is thus advantageously made possible that maximum stresses are present farther away from the access channel and less concentrated in contrast to conventional micromechanical components. In addition, it may thus be advantageously achieved that the solidified material area is situated solely beneath a plane extending generally along the surface.

According to one preferred refinement it is provided that an elevation of the solidified material area is situated on a side of the solidified material area facing away from the first cavity.

According to one preferred refinement it is provided that the substrate and/or the cap include silicon.

According to one preferred refinement it is provided that the reflection area includes an additional layer. According to one preferred refinement it is also provided, for example, that the reflection area or the additional layer includes aluminum or gold or Al or Au. According to one preferred refinement it is also provided, for example, that the reflection area or the additional layer also includes a reflecting layer having a defined thickness made of oxide or nitride.

According to one preferred refinement it is provided that the first pressure is lower than the second pressure, a first sensor unit for measuring the rotation rate being situated in the first cavity and a second sensor unit for measuring the acceleration being situated in the second cavity. Thus, a mechanically robust micromechanical component for measuring the rotation rate and the acceleration is provided with optimum operating conditions both for the first sensor unit and for the second sensor unit.

DETAILED DESCRIPTION OF EXAMPLE EMBODIMENTS

Figure 1:
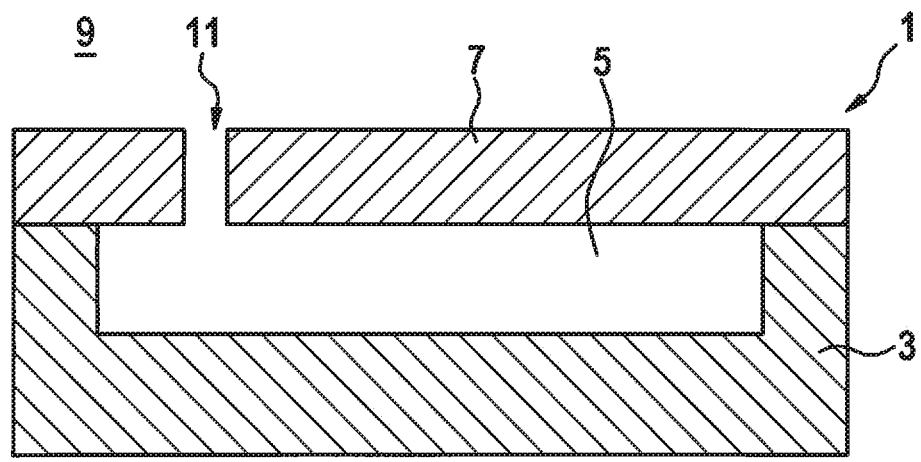
FIG. 1 shows a micromechanical component including an open access opening according to one exemplary specific embodiment of the present invention in a schematic representation.

In the different figures, identical parts are provided with identical reference numerals and are therefore generally also only named or mentioned once.

Figure 2:
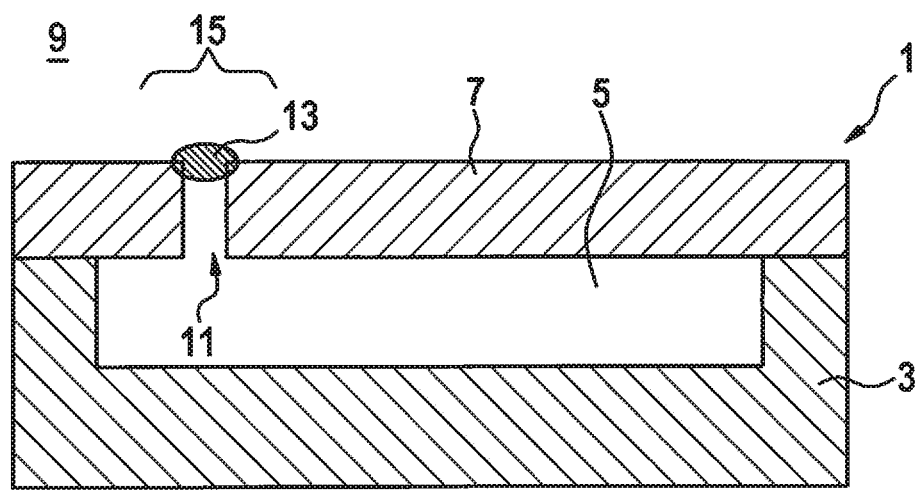
FIG. 2 shows the micromechanical component according to FIG. 1 including a sealed access opening in a schematic representation.

FIG. 1 and FIG. 2 show a schematic depiction of a micromechanical component 1 including an open access opening 11 in FIG. 1, and including a sealed access opening 11 in FIG. 2 according to one exemplary specific embodiment of the present invention. Micromechanical component 1 hereby includes a substrate 3 and a cap 7. Substrate 3 and cap 7 are connected to one another, preferably hermetically, and together enclose a first cavity 5. For example, micromechanical component 1 is formed in such a way that substrate 3 and cap 7 additionally together enclose a second cavity. The second cavity is, however, not shown in FIG. 1 and FIG. 2.

For example, a first pressure prevails in first cavity 5, in particular in the case of sealed access opening 11, as shown in FIG. 2. In addition, a first gas mixture with a first chemical composition is enclosed in first cavity 5. Furthermore, for example, a second pressure prevails in the second cavity and a second gas mixture with a second chemical composition is enclosed in the second cavity. Access opening 11 is preferably situated in substrate 3 or in cap 7. In the case of the exemplary embodiment presented here, access opening 11 is situated for example in cap 7. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for measuring the rotation rate is situated in first cavity 5, not shown in FIG. 1 and FIG. 2, and a second micromechanical sensor unit for measuring the acceleration is situated in the second cavity, not shown in FIG. 1 and FIG. 2.

Figure 3:
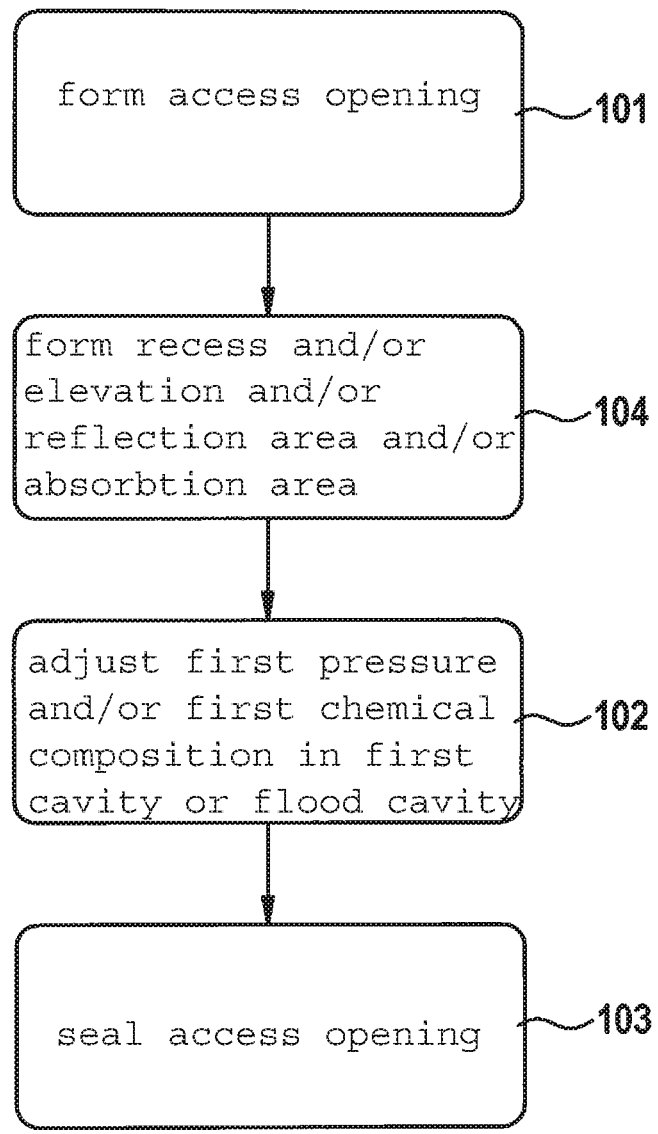
FIG. 3 shows a method for manufacturing a micromechanical component according to one exemplary specific embodiment of the present invention in a schematic representation.

A method for manufacturing micromechanical component 1 according to an exemplary specific embodiment of the present invention is shown in a schematic representation in FIG. 3. In a first method step 101, in particular, narrow access opening 11 in substrate 3 or in cap 7 is formed connecting first cavity 5 to surroundings 9 of micromechanical component 1. FIG. 1 shows, for example, micromechanical component 1 after first method step 101. In addition, in a second method step 102, the first pressure and/or the first chemical composition is adjusted in first cavity 5, or first cavity 5 is flooded with the desired gas and the desired internal pressure via the access channel.

Furthermore, for example, in a third method step 103, access opening 11 is sealed by introducing energy and heat into an absorbing part 21 of substrate 3 or cap 7 with the aid of a laser. It is, for example, also provided that in third method step 103, the area around the access channel is merely preferably only locally heated by a laser and the access channel is hermetically sealed. Thus, it is advantageously possible to also provide the method according to the present invention with other energy sources besides a laser for sealing access opening 11. FIG. 2 shows, for example, micromechanical component 1 after third method step 103.

Chronologically after third method step 103, mechanical stresses may occur in a lateral area 15, shown, for example, in FIG. 2, on surface 19, and in the depth perpendicular to a projection of lateral area 15 onto surface 19, i.e. along access opening 11 and in the direction of first cavity 5 of micromechanical component 1. These mechanical stresses, in particular local mechanical stresses, prevail in particular on or in the vicinity of an interface between a material area 13 of cap 7, which seals access opening 11 in a liquid aggregate state in third method step 103 and transitions into a solid aggregate state after third method step 103, and a residual area of cap 7, which remains in a solid aggregate state during third method step 103. In FIG. 2, material area 13 of cap 7 sealing access opening 11 is hereby merely indicated schematically or schematically depicted, in particular with respect to its lateral extension or form extending in particular in parallel to surface 19, and in particular with respect to its expansion or configuration running perpendicular to the lateral extension, in particular perpendicular to surface 19.

As is shown as an example in FIG. 3, additionally, in a fourth method step 104: a recess 17 is formed in a surface 19 of substrate 3 or of cap 7 facing away from first cavity 5 in the area of access opening 11 for accommodating a material area 13 of substrate 3 or cap 7 converted into a liquid aggregate state in third method step 103; and/or an elevation is formed on surface 19 of substrate 3 or of cap 7 facing away from first cavity 5 in the area of access opening 11 to guide material area 13 of substrate 3 or cap 7 converted into a liquid aggregate state in third method step 103 generally away from access opening 11 and generally in parallel to surface 19; and/or a reflection area is formed on or in surface 19 of substrate 3 or of cap 7 facing away from first cavity 5 in the area of access opening 11 for increased reflection, in contrast to remaining surface 19, of laser radiation 211 used in third method step 103 for introducing the energy and heat; and/or an absorption area is formed on or in surface 19 of substrate 3 or of cap 7 facing away from first cavity 5 in the area of access opening 11 for increased absorption, in contrast to remaining surface 19, of laser radiation 211 used in third method step 103 for introducing the energy and heat.

Figure 4A:
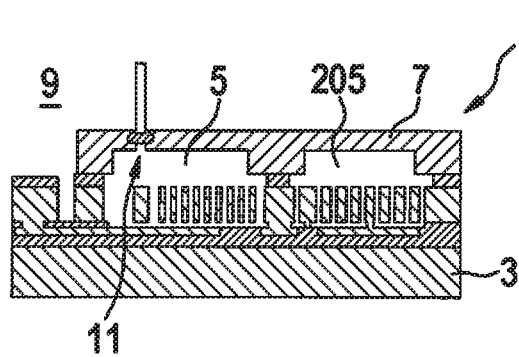
FIG. 4 shows a conventional micromechanical component in a schematic representation.
Figure 4B:
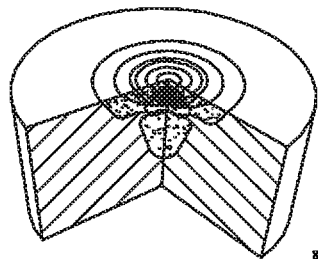
Figure 4C:
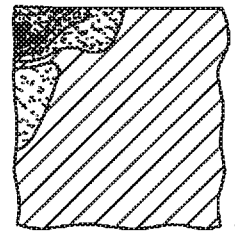
Figure 5:
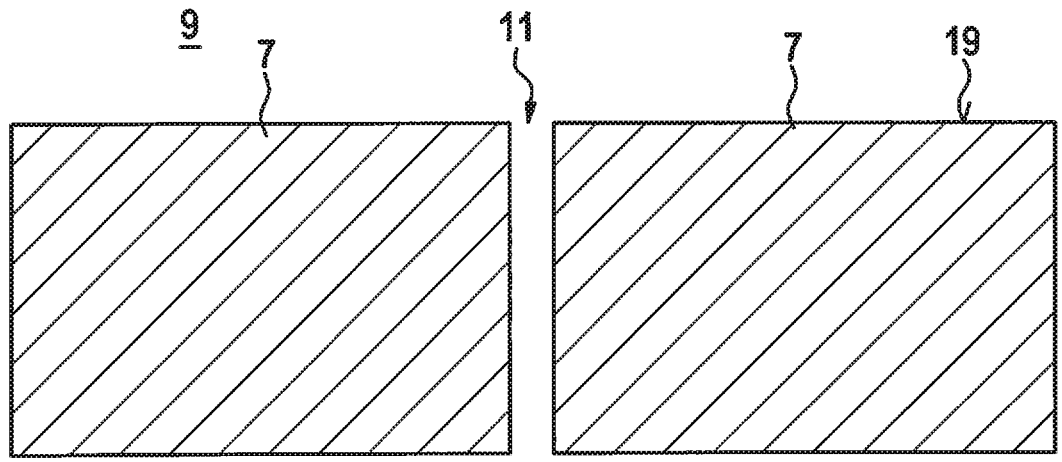
FIG. 5, FIG. 6, FIG. 7, FIG. 8, and FIG. 9 show a subarea of the micromechanical component according to FIG. 4 at different points in time of a conventional manufacturing method in schematic representations.

In FIG. 4A, for example, a conventional micromechanical component 1 is depicted. For example, in this case a micromechanical component 1 is shown with a combined acceleration and rotation rate sensor, which are hermetically sealed with a cap wafer. In second cavity 205 of the acceleration sensor, a higher internal pressure is adjusted during the capping process. Using the conventional method, a lower internal pressure is adjusted in first cavity 5 of the rotation rate sensor. If a crack forms in cap 7, for example after adjusting the internal pressure in first cavity 5, first cavity 5 of the rotation rate sensor is flooded, for example, with air, and the rotation rate sensor may no longer oscillate due to the air damping and for example, malfunctions. Finally, in FIG. 4B and in FIG. 4C, an area of sealed access opening 11 or of solidified material area 13 is shown. FIG. 4B and FIG. 4C hereby show areas with high mechanical stresses or high tensile stresses.

In FIG. 5, FIG. 6, FIG. 7, FIG. 8, and FIG. 9, a subarea of a conventional micromechanical component 1 according to FIG. 4 is schematically shown at different points in time of a conventional method.

Figure 6:
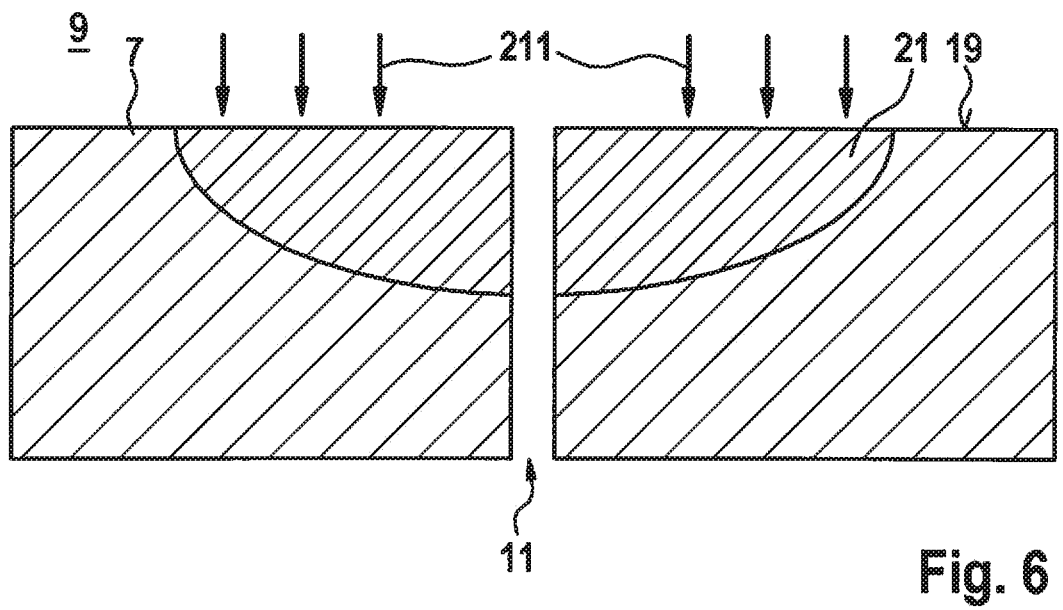

In FIG. 6, for example, absorbing part 21 or the area which absorbs the laser energy is depicted, which at least partially absorbs laser radiation 211 schematically indicated by arrows. Laser radiation 211 or a laser pulse 211 or multiple laser pulses 211 heat the material around the access hole or the material around the access hole is melted using a laser pulse 211. Laser pulse 211 is hereby preferably positioned centered over the access hole in order to manage with a preferably small melting zone and thus using little laser output.

Figure 7:
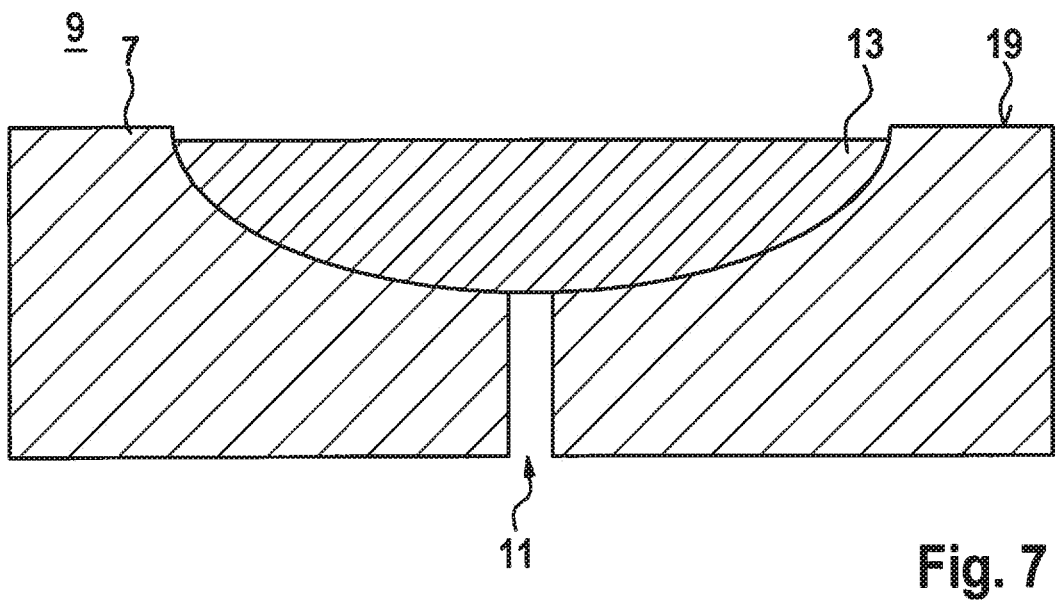

In FIG. 7, material area 13 is depicted in the liquid aggregate state or as melted material 13. FIG. 7 shows how the melted material or the melt distributes within the molten area and seals the access hole. Subsequently, the melt or material area 13 solidifies.

Figure 8:
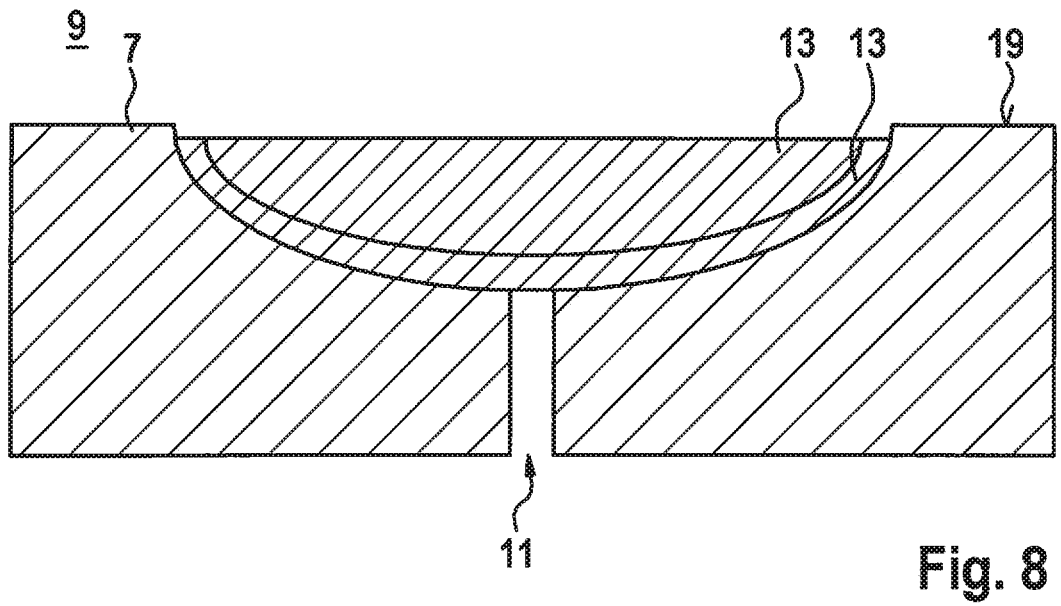

In FIG. 8, furthermore, a point in time is depicted at which material area 13 has already partially transitioned from the liquid aggregate state into the solid aggregate state. The part of material area 13 already transitioned into the solid aggregate state is represented as a solidification front.

Figure 9:
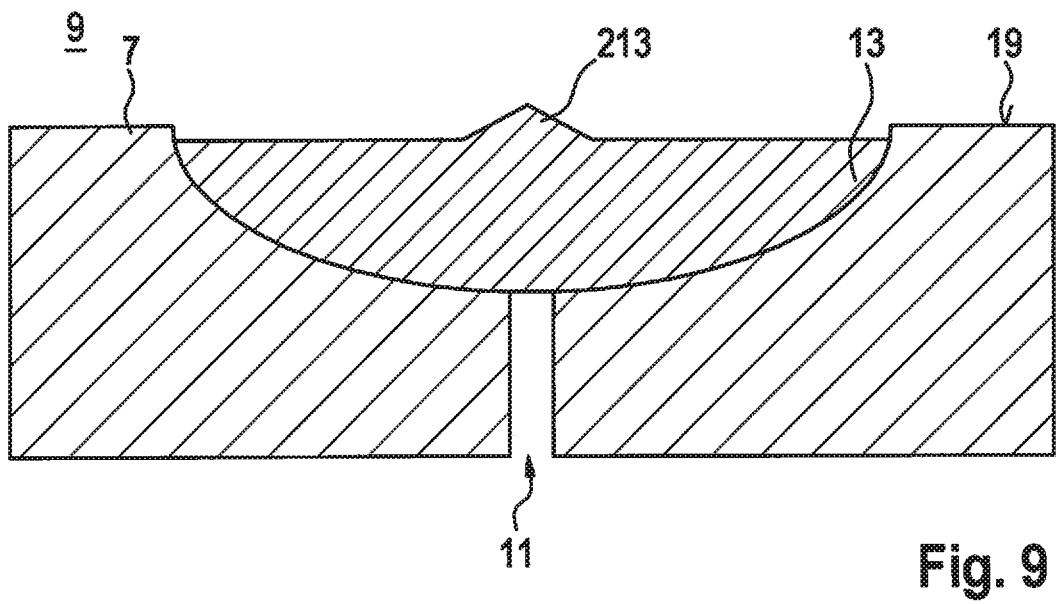

Finally, FIG. 9 shows as an example, how complete material area 13 has transitioned into the solid aggregate state and an elevation 213 of solidified material area 13 has formed centrally over access opening 11 and which projects beyond a plane extending along surface 19. Elevation 213 is hereby depicted, for example, as a conical bulge which projects toward the substrate.

Due to the method steps shown in FIG. 5, FIG. 6, FIG. 7, FIG. 8, and FIG. 9, stresses, for example, are caused in the cap material or in cap 7 or in substrate 3. These stresses or this stress or these mechanical tensions occur in particular during solidification of material area 13. For example, the largest stress occurs at the deepest point in the melting zone. Clearly, this may be, for example, explained in that the melt is mostly surrounded by a solid body there and therefore may react most poorly to the different expansion movements. Directly at the surface, the material may, for example, react with a bulge or with a retraction. In the center of the melting zone, this may also be observed very clearly. Since, for example, the silicon solidifies from the edge inward and expands during solidification, a cone-shaped bulge occurs, for example, in the center of the melting zone as in FIG. 9. This is, for example, so high that it protrudes some μm beyond the substrate.

Two points, for example, are critical to the system shown in FIG. 9:
1. The area with the highest stress in the material lies exactly in and above the area of access opening 11. The now sealed access opening 11 is a disturbance in the material volume. It therefore functions, for example, as an originating point for cracks and thereby weakens the material.
2. A conical point 213 occurs, for example, over the access opening and protrudes significantly beyond the substrate. For further processing and use in the field, there is a risk that the point may be mechanically loaded and thus generate cracks in the material.

In FIG. 10, FIG. 11, FIG. 12, FIG. 13, and FIG. 14, a subarea of a micromechanical component according to one exemplary specific embodiment of the present invention is schematically depicted at different points in time of a method according to the present invention. For example, recess 17 or a prestructuring of substrate 3 around access opening 11 or around access channel 11 is hereby formed in such a way that solidified material area 13 is situated between a plane extending generally along surface 19 and first cavity 5. This is shown by way of example in FIG. 14.

In addition or alternatively, recess 17 is formed, for example, in such a way that a first surface of a projection of recess 17 onto a plane extending generally along surface 19 is smaller than a second surface of a projection of solidified material area 13 or of absorbing part 21 of substrate 3 or cap 7 onto the plane.

Furthermore, recess 17 is preferably formed in a plane extending generally in parallel to surface 19 generally rotationally symmetrical and/or ring shaped with respect to access opening 11 or to the center of mass of solidified material area 13 or to absorbing part 21 of substrate 3 or of cap 7.

Figure 10:
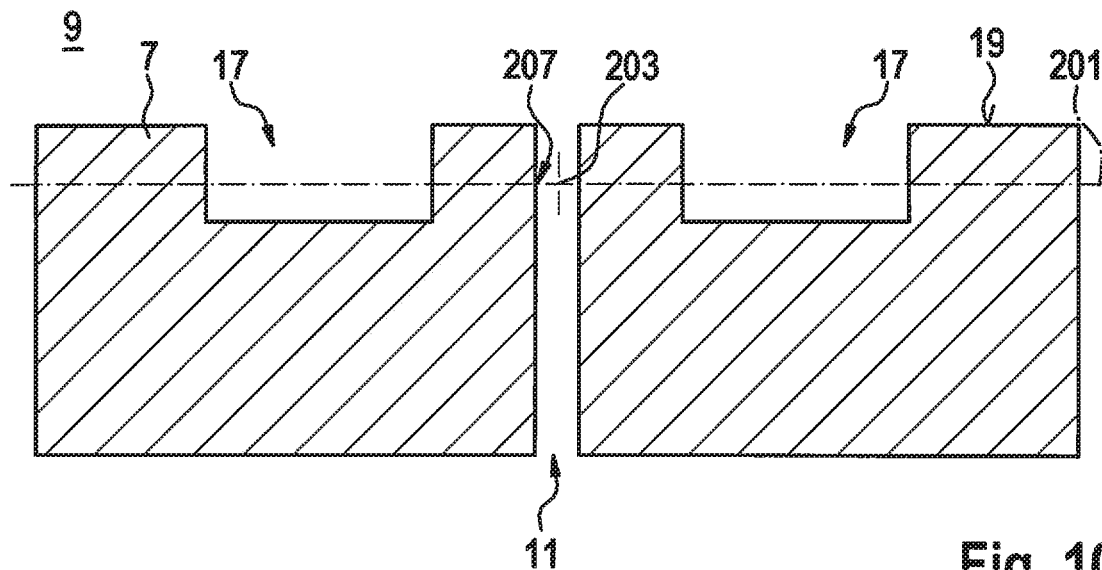
FIG. 10, FIG. 11, FIG. 12, FIG. 13, and FIG. 14 show a subarea of a micromechanical component according to one exemplary specific embodiment of the present invention at different points in time of a method according to the present invention in schematic representations.
Figure 11:
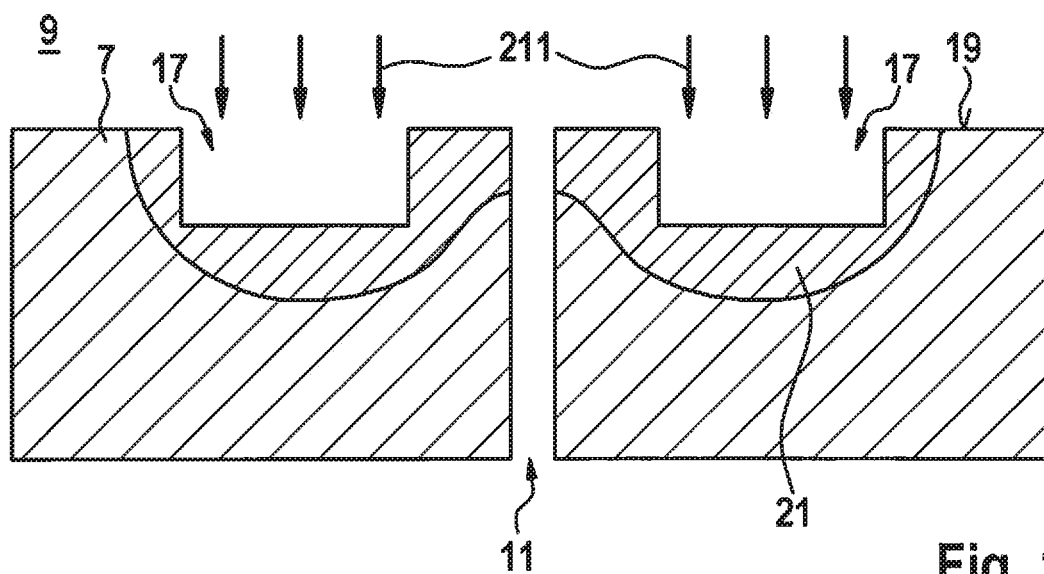
Figure 14:
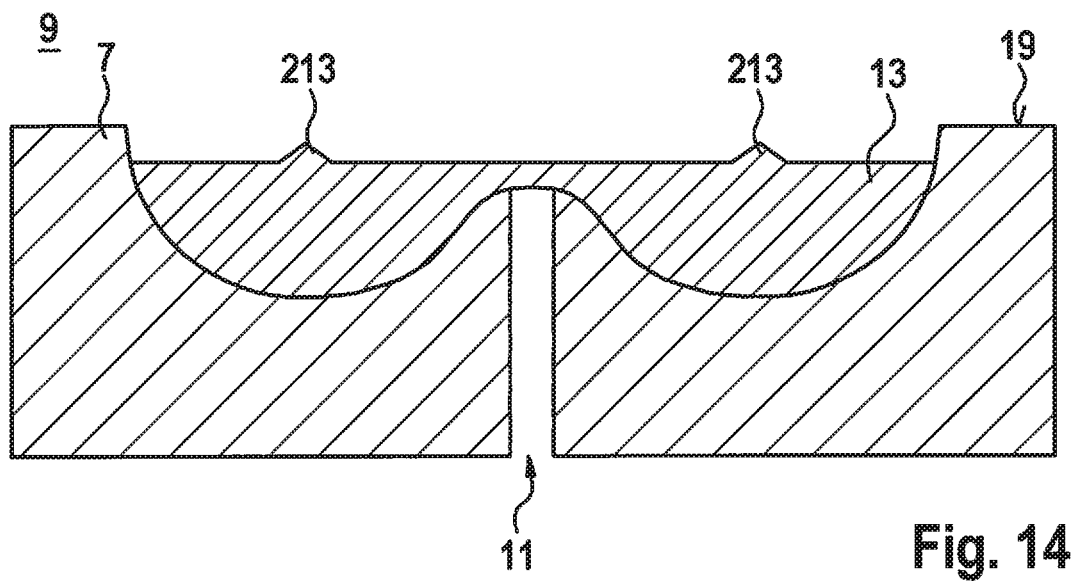

Furthermore, FIG. 10 shows how recess 17 is formed in an additional plane 201 extending generally in parallel to surface 19, spaced in additional plane 201 generally twice as far from a center point 203 of access channel 11, as a maximum extension 207 of access channel 11 in additional plane 201 spaced from center point 203. It is provided, in particular, that an inner radius of the ring or of ring-shaped recess 17 is at least twice as large as a radius of the access hole or of access channel 11. Furthermore, elevation 213 of solidified material area 13 is formed, for example, in the plane extending generally in parallel to surface 19 generally rotationally symmetrical and/or ring shaped with respect to access channel 11 or to a center of mass of solidified material area 13 or to absorbing part 21 of substrate 3 or of cap 7. In FIG. 14, elevation 213 is shown, formed for example as a ring-shaped bulge without projection toward the substrate.

Figure 13:
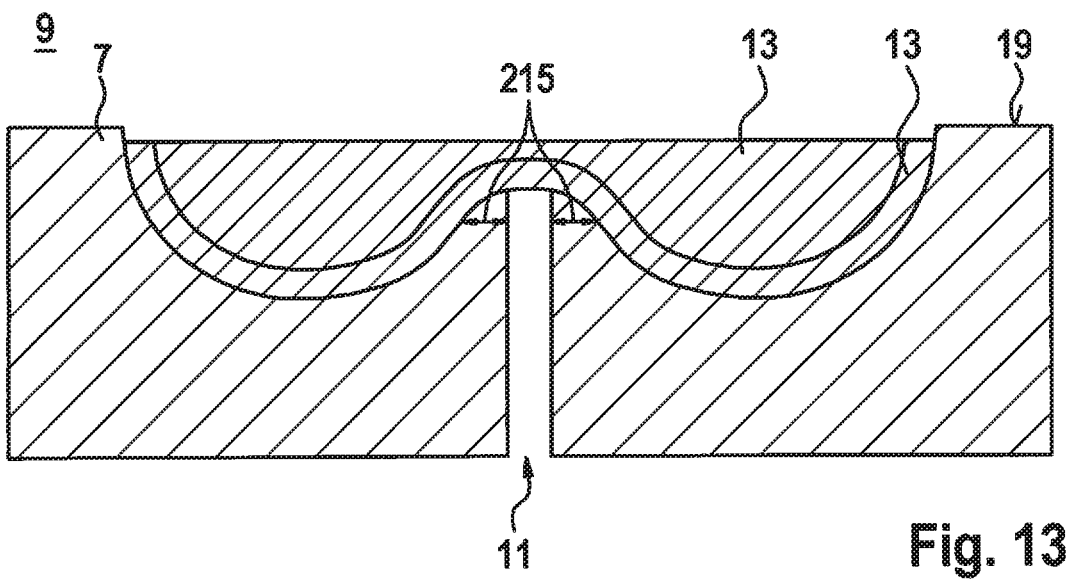

FIG. 13 schematically depicts, for example, an area 215 with reduced stress or with reduced mechanical tension and an evasive movement 215 provided for tension reduction.

Figure 12:
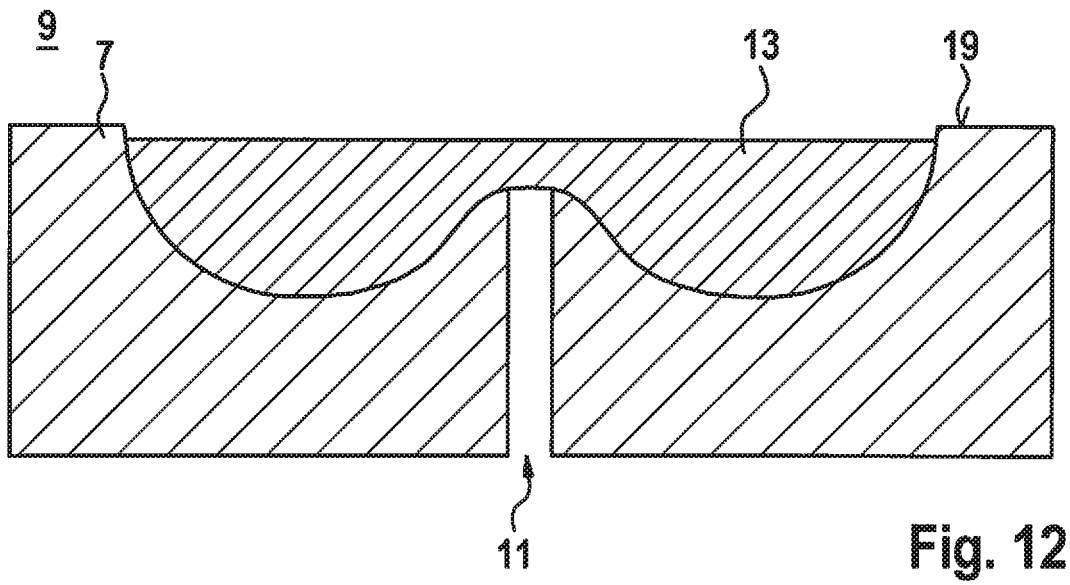

Due to the method steps schematically shown in FIG. 10, FIG. 11, FIG. 12, FIG. 13, and FIG. 14, it is achieved that by preprocessing the material in the area of access hole 11, a melting bath 13 arises after laser pulse 211 which no longer has the classic tub shape. The method according to the present invention is, for example, possible due to a prestructuring, as shown in FIG. 10, for example, as an etching of the area which is to be melted using laser pulse 211. Areas, which are hereby to be melted particularly deeply, may be etched somewhat deeply. For example, the laser light correspondingly penetrates deeper into the material relative to the height of the substrate surface. Melted material from areas lying higher runs into deeper-lying areas as soon as the material becomes liquid. The inverse behavior applies for areas which are not structured. In particular, as is shown in FIG. 12, a shape of the melting zone or of material area 13 which is in the liquid aggregate state is selected in such a way that material area 13 melts more deeply in a ring shape around access opening 11.

As depicted in FIG. 13 and FIG. 14, the areas with the highest stress during the solidification process no longer lie over or directly above access hole 11, as in the conventional method, but instead lie around access hole 11 in a ring shape, in particular with a lateral distance to access hole 11. Furthermore, the maximum stress or the maximum mechanical tension in the material is reduced since the position with the maximum mechanical tension is no longer concentrated punctiform in the center of the tub, as shown in FIG. 7, FIG. 8, and FIG. 9, but instead is distributed across a ring, for example, generally along elevation 213.

Due to the changed melting zone, in contrast to the conventional method, no conical point 213 is created in the center of melting zone 13, but instead a ring-shaped elevation 213 around the center point of the melting zone 13, which has a significantly lower height due to its radial expansion and is significantly less sensitive with respect to mechanical loads due to its locally greater expansion.

What is claimed is:

1. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:
   in a first step, forming an access opening, connecting the first cavity to surroundings of the micromechanical component, in the substrate or in the cap;
   in a second step, adjusting at least one of the first pressure and the first chemical composition, in the first cavity;
   in a third step, forming a receptacle at a surface of the substrate or of the cap in a region of the access opening, wherein the receptacle includes a base, an open side opposite the base and facing away from the first cavity, and a sidewall that separates the receptacle from the access opening; and
   in a fourth step, using a laser to introduce energy and heat into the receptacle towards the base of the receptacle, and thereby into an absorbing part of the substrate or the cap, which converts material of the substrate or the cap around the receptacle into a liquid aggregate that fills at least a part of the receptacle and a mouth of the access opening, thereby sealing the access opening.

2. The method as recited in claim 1, wherein the cap together with the substrate encloses a second cavity, a second pressure prevailing and a second gas mixture with a second chemical composition being enclosed in the second cavity.

3. The method as recited in claim 1, wherein the receptacle is formed in such a way that the liquid aggregate solidifies into solidified material situated between a plane extending along the surface and the first cavity.

4. The method as recited in claim 1, wherein the receptacle is formed in such a way that a first surface, which is of a projection of the receptacle onto a plane extending along the surface is smaller than a second surface, which is of a projection of solidified material formed by solidification of the liquid aggregate onto the plane.

5. The method as recited in claim 1, wherein the receptacle is formed so that, in at least one plane, an edge of the receptacle closest to the access channel is spaced twice as far from a center point of the access channel as a maximum extension of the access channel is spaced apart from the center point in the at least one plane.

6. The method as recited in claim 1, wherein the formation of the receptacle is performed by forming a recess in the substrate or the cap.

7. The method as recited in claim 1, wherein the formation of the receptacle includes forming an elevation on a surface of the substrate or the cap.

8. The method as recited in claim 1, wherein the receptacle is annular and surrounds the access opening, the sidewall being a radially interior annular wall of the receptacle.

9. The method as recited in claim 8, wherein the liquid aggregate solidifies, thereby forming an annular ridge circling a location of the sealed access opening.

10. The method as recited in claim 8, wherein the annular receptacle is rotationally symmetrical relative to the access opening.

11. The method as recited in claim 8, wherein the annular receptacle is rotationally symmetrical relative to a center of mass of solidified material formed by solidification of the liquid aggregate.

12. The method as recited in claim 9, wherein the annular ridge is rotationally symmetrical and ring shaped, with respect to the access channel or to a center of mass of solidified material into which the liquid aggregate solidifies.

13. The method as recited in claim 1, wherein the conversion of the material of the substrate or cap around the receptacle into the liquid aggregate includes melting an upper edge of the sidewall.

14. The method as recited in claim 1, wherein the conversion of the material of the substrate or cap around the receptacle into the liquid aggregate includes melting an upper edge of the sidewall, without melting of at least a part of the sidewall below the upper edge.

15. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:
   in a first step, forming an access opening, connecting the first cavity to surroundings of the micromechanical component, in the substrate or in the cap;
   in a second step, adjusting at least one of the first pressure and the first chemical composition, in the first cavity;
   in a third step, forming a reflection area on or in the surface of the substrate or of the cap facing away from the first cavity in an area of the access opening for increased reflection, in contrast to a remainder of the surface, of laser radiation; and
   in a fourth step, using a laser to expose the surface to the laser radiation, thereby introducing energy and heat into part of the substrate or the cap, thereby sealing the access opening.

16. A method for manufacturing a micromechanical component including a substrate and a cap connected to the substrate and together with the substrate enclosing a first cavity, a first pressure prevailing and a first gas mixture with a first chemical composition being enclosed in the first cavity, the method comprising:

in a first step, forming an access opening, connecting the first cavity to surroundings of the micromechanical component, in the substrate or in the cap;

in a second step, adjusting at least one of the first pressure and the first chemical composition, in the first cavity;

in a third step, forming an absorption area on or in the surface of the substrate or of the cap facing away from the first cavity in an area of the access opening for increased absorption, in contrast to a remainder of the surface, of laser radiation; and in a fourth step, using a laser to expose the surface to the laser radiation, thereby introducing energy and heat into part of the substrate or the cap, thereby sealing the access opening.

* * * * *